(12) United States Patent
Humphrey et al.

(10) Patent No.: US 8,446,044 B2
(45) Date of Patent: May 21, 2013

(54) POWER CONVERSION AND DISTRIBUTION SCHEME FOR ELECTRONIC EQUIPMENT RACKS

(75) Inventors: Daniel Humphrey, Houston, TX (US); Mohamed Amin Bemat, Cypress, TX (US); David P. Mohr, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 306 days.

(21) Appl. No.: 12/607,434

(22) Filed: Oct. 28, 2009

(65) Prior Publication Data

US 2011/0096522 A1  Apr. 28, 2011

(51) Int. Cl.
*H02J 3/00* (2006.01)
*H02J 9/00* (2006.01)

(52) U.S. Cl.
USPC .................. 307/82; 307/64; 307/66; 713/300

(58) Field of Classification Search
None
See application file for complete search history.

(56) References Cited

U.S. PATENT DOCUMENTS

| | | | | |
|---|---|---|---|---|
| 5,247,205 A * | 9/1993 | Mototani et al. | ................. | 307/66 |
| 5,477,091 A * | 12/1995 | Fiorina et al. | .................... | 307/66 |
| 5,745,670 A * | 4/1998 | Linde | .............................. | 714/22 |
| 5,932,933 A * | 8/1999 | Asanuma | ........................ | 307/18 |
| 6,153,946 A * | 11/2000 | Koch et al. | ...................... | 307/64 |
| 2003/0048647 A1 * | 3/2003 | Sadler et al. | ..................... | 363/65 |
| 2003/0222618 A1 * | 12/2003 | Kanouda et al. | .............. | 320/116 |
| 2004/0000815 A1 * | 1/2004 | Pereira | ............................ | 307/11 |
| 2004/0201279 A1 * | 10/2004 | Templeton | ...................... | 307/11 |
| 2005/0036248 A1 * | 2/2005 | Klikic et al. | ..................... | 361/42 |
| 2005/0102544 A1 * | 5/2005 | Brewer et al. | ................. | 713/320 |
| 2007/0217125 A1 * | 9/2007 | Johnson | ........................ | 361/600 |
| 2010/0187908 A1 * | 7/2010 | Okano et al. | ..................... | 307/64 |

* cited by examiner

*Primary Examiner* — Hal Kaplan

(57) ABSTRACT

A system is provided for powering electronic system modules in an equipment rack. A circuit breaker is mounted to the rack and configured to receive a rack AC power feed. An AC-DC converter module is mounted to the rack and configured to receive the rack AC power feed from the circuit breaker and to convert it to a first DC voltage at an output. A set of switching DC-DC output converters is provided. Each is disposed physically proximate to or within one of the electronic system modules and is configured to convert the first DC voltage to a second DC voltage suitable for consumption by the proximate electronic system module. A bus is configured to distribute the first DC voltage from the output to each of the switching DC-DC output converters.

20 Claims, 6 Drawing Sheets

POWER CONVERSION AND DISTRIBUTION SCHEME FOR ELECTRONIC EQUIPMENT RACKS

FIELD OF THE INVENTION

This invention relates generally to power supplies and power distribution systems for electronic devices.

BACKGROUND

A traditional data center houses numerous racks within which server computers or other electronic devices such as networking and storage equipment are mounted. External to these equipment racks, a traditional data center must also include space for at least one uninterruptible power supply as well as space for large-capacity batteries, static transfer switches, step down transformers, power distribution conduits and the like.

BRIEF DESCRIPTION OF THE DRAWINGS

Numerous example embodiments of the invention will be described below with reference to the drawings. Like numbers used in the drawings will refer to like and corresponding parts in the various embodiments.

DETAILED DESCRIPTION

Figure 1:
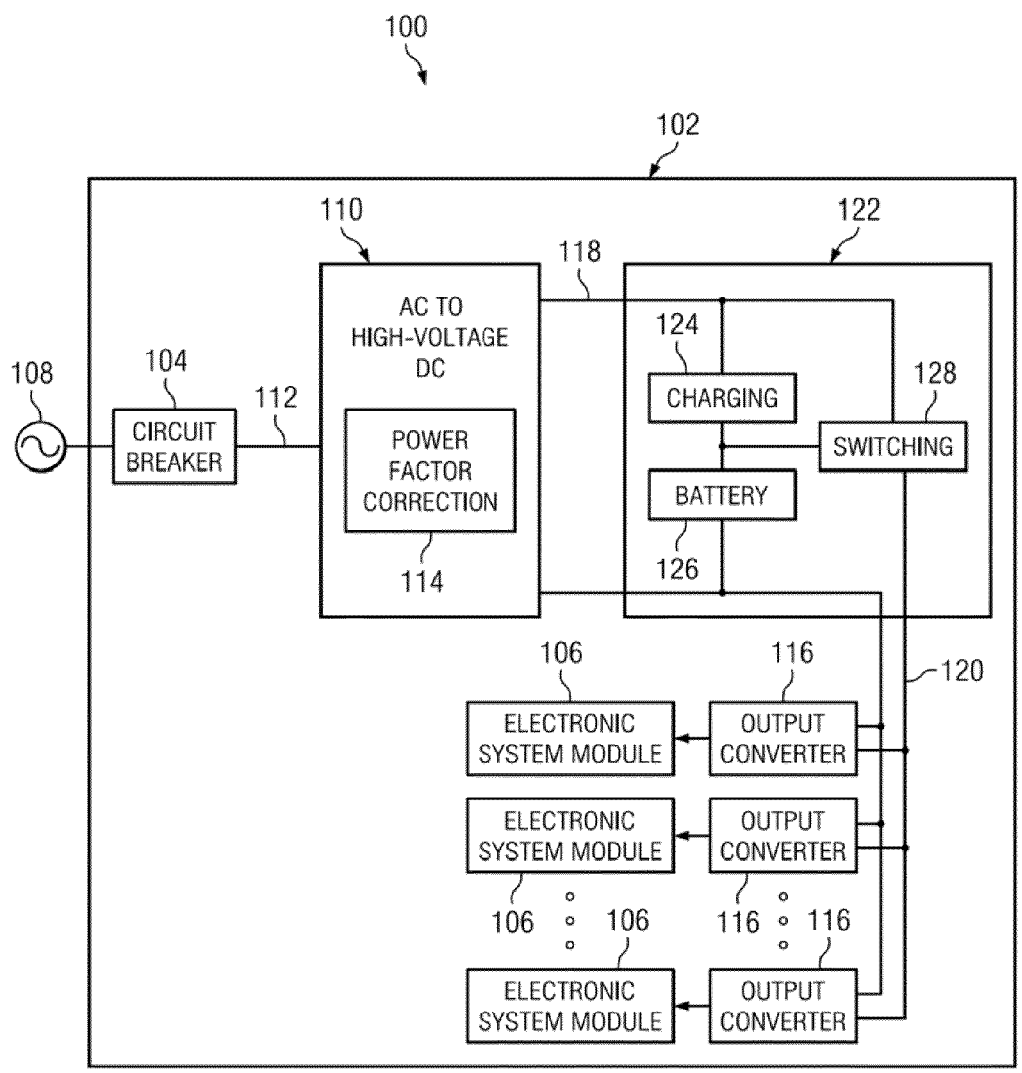
FIG. 1 is a block diagram illustrating a power supply and distribution scheme for an electronic equipment rack according to an embodiment of the invention.

System 100 in FIG. 1 illustrates a power supply and distribution scheme according to an exemplary embodiment of the invention. System 100 includes an electronic equipment rack 102 having a circuit breaker 104 mounted therein. Rack 102 is configured to receive multiple electronic system modules 106. Electronic system modules 106 may be of any type. They may be all of the same type or may include a variety of different module types. In one example embodiment, one or more of modules 106 may include a server computer system board and rack 102 may be a server computer rack. Modules 106 also may include, by way of further example, other components such as network switches or routers, data storage equipment, test equipment and the like.

Circuit breaker 104 is configured to receive a rack alternating current ("AC") power feed 108. An alternating-current-to-direct-current ("AC-DC") converter module 110 is also mounted to rack 102 and is configured to receive the AC power feed from circuit breaker 104 as shown at 112. AC-DC converter module 110 may include power factor correction circuitry 114.

A set of switching DC-DC output converters 116 is also provided in rack 102. Each DC-DC output converter 116 is disposed physically proximate to one of electronic system modules 106. This may be accomplished, for example, by mounting a DC-DC output converter 116 physically nearby an electronic system module 106 or by integrating a DC-DC output converter 116 within an electronic system module 106 as one of its component parts.

AC-DC converter module 110 is configured to convert AC power feed 112 to a high-voltage DC potential at an output 118 for consumption by DC-DC output converters 116. Although the level of the DC potential may vary according to the needs of the implementation, typically this voltage level will be on the order of 350VDC or greater. This level can of course be lower or higher in various embodiments without deviating from the scope of the invention. Each DC-DC output converter 116 is configured to convert the DC voltage from output 118 to one or more lower DC voltages suitable for consumption by the electronic system module 106 with which the output converter 116 is proximally associated. The latter voltage levels may also vary with the application, but will typically be on the order of 12VDC, 5VDC or lower. In some embodiments, all of the DC-DC output converters may be identical. In other embodiments, some or all of the DC-DC output converters may differ from one another. A bus 120 is used to distribute the high-voltage DC level from output 118 to each of DC-DC output converters 116 as shown. DC-DC output converters 116 need not include any power factor correction circuitry. AC-DC converter module 110 may comprise a single converter, or may comprise two or more redundant converters operating in parallel.

In further embodiments, a battery backup system 122 may be included within rack 102. Charging system 124 may be configured as shown to take charging power from output 118 of AC-DC converter module 110. Battery or batteries 124 are switchably connectable to bus 120 as shown at 128 so that in the event of a failure either in rack AC power feed 108 or a failure in AC-DC converter module 110, battery backup system 122 may keep bus 120 at or near its nominal high-voltage DC level.

Figure 2:
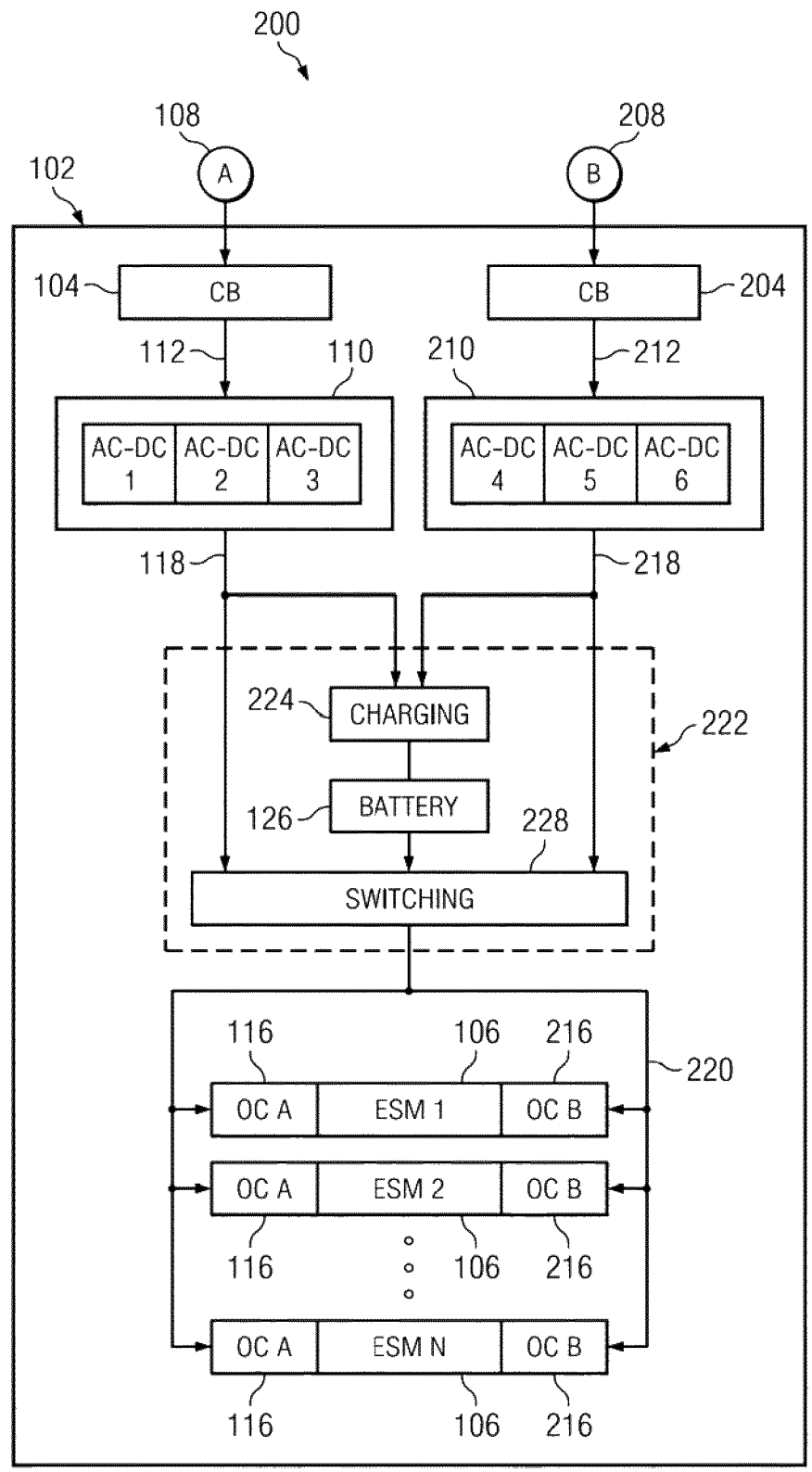
FIG. 2 is a block diagram illustrating a first example implementation of the scheme of FIG. 1 in a rack having redundant power supplies and using parallel high-voltage DC busses, according to an embodiment of the invention.

System 200 shown in FIG. 2 is an embodiment of the scheme of FIG. 1 that employs more redundancy and that uses parallel high-voltage DC buses. In system 200, a second rack AC power feed 208 like feed 108 is provided to rack 102 and connected to circuit breaker 204. A second AC-DC converter module 210 like module 110 is mounted to rack 102 and receives feed 208 from circuit breaker 204 as shown at 212. AC-DC converter module 210 is configured to convert AC feed 212 to the same high-voltage DC level that converter 110 produces. Converter 210 produces its DC level at output 218. As indicated in the drawings, each of AC-DC converter modules 110, 210 may include one or more redundant AC-DC conversion units. For example, AC-DC conversion unit 1, AC-DC conversion unit 2 and AC-DC conversion unit 3 may all cooperate to provide redundancy within module 110. And AC-DC conversion unit 4, AC-DC conversion unit 5 and AC-DC conversion unit 6 may all cooperate to provide redundancy within module 210.

System 200 also includes a second set of switching DC-DC output converters 216. Each of converters 216 is configured like converters 116 are configured. But in the embodiment of system 200, each of electronic system modules 106 is associated with at least two redundant output converters. The first, labeled "OCA," is taken from the first set of output converters 116. The second, labeled "OC B," is taken from the second set of output converters 216 as shown. In the embodiment of system 200, bus 220 is switchably connectable to both of outputs 118 and 218 as shown at 222, and connects those outputs to each of the redundant output converters 116, 216 in parallel.

Figure 3:
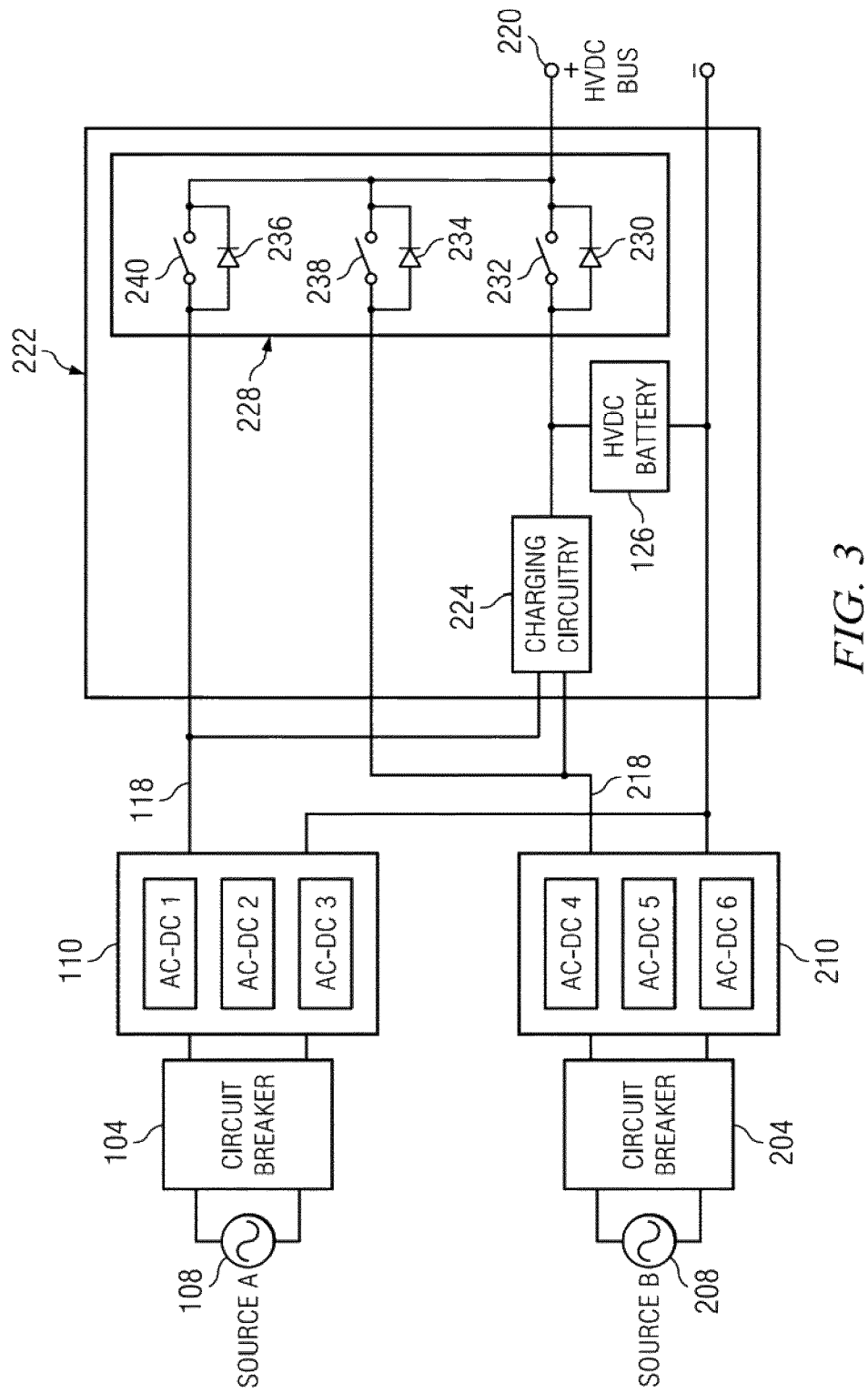
FIG. 3 is a schematic diagram corresponding to the embodiment of FIG. 2.

FIG. 3 is a schematic diagram corresponding to the embodiment of FIG. 2. Charging circuitry 224 is configured to take charging power from either or both of AC-DC converter outputs 118, 218. Beyond that, charging circuitry 224 may take a variety of conventional forms depending on what type of battery is chosen for high-voltage DC battery 126. If desired, the voltage level kept on battery 126 may be slightly below that of outputs 118, 218 so that under normal operating conditions diode 230 will not be forward biased. But in the event of a drop in voltage on bus 220, diode 230 will become forward biased. When current flow though diode 230 is sensed, switch 232 may be closed in order to connect battery 126 to bus 220. Diodes 234, 236 and switches 238, 240 may be designed to operate in a similar manner. In other embodiments, different switching circuitry 228 may be employed with equivalent effect.

Figure 4:
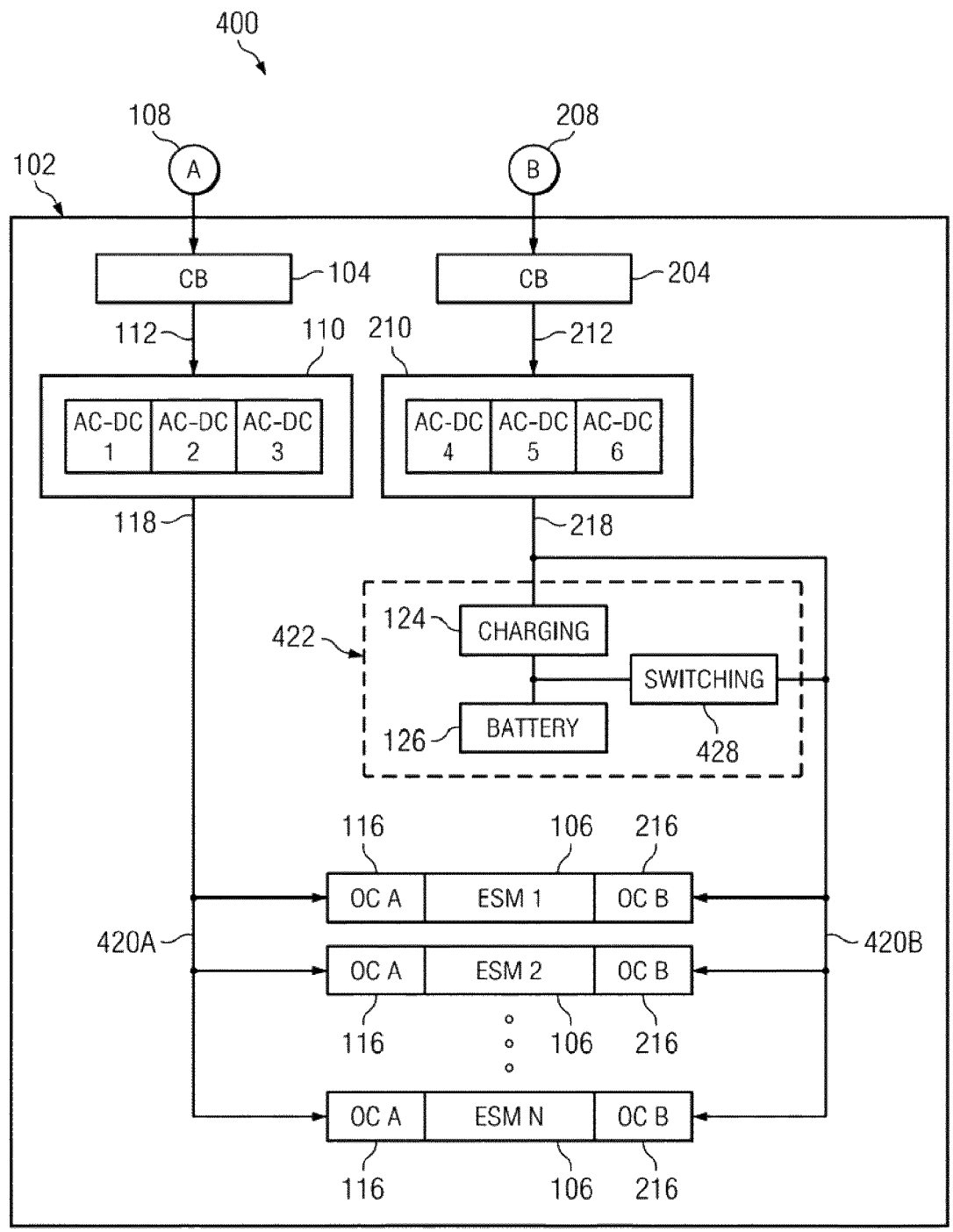
FIG. 4 is a block diagram illustrating a second example implementation of the scheme of FIG. 1 in a rack having redundant power supplies and using independent high-voltage DC busses, according to an embodiment of the invention.

System 400 shown in FIG. 4 is an embodiment of the scheme of FIG. 1 that employs more redundancy and that uses independent high-voltage DC buses. As in system 200, system 400 includes separate rack AC power feeds 108, 208 connected to circuit breakers 104, 204 respectively and feeding redundant AC-DC converter modules 110, 210 as shown. But in contrast to system 200, system 400 employs independent high-voltage DC buses 420A and 420B. Bus 420A is connected to output 118 and distributes the high-voltage DC level from converter 110 to each of DC-DC output converters 116. Bus 420B is connected to output 218 and distributes the high-voltage DC level from converter 210 to each of DC-DC output converters 216.

In the embodiment of system 400, battery backup system 422 need not be connected to both of buses 420A and 420B, but is instead shown connected only to bus 420B. Even so, system 400 can accommodate any single failure in rack AC power feeds 108, 208 or in AC-DC converter modules 110, 210.

Figure 5:
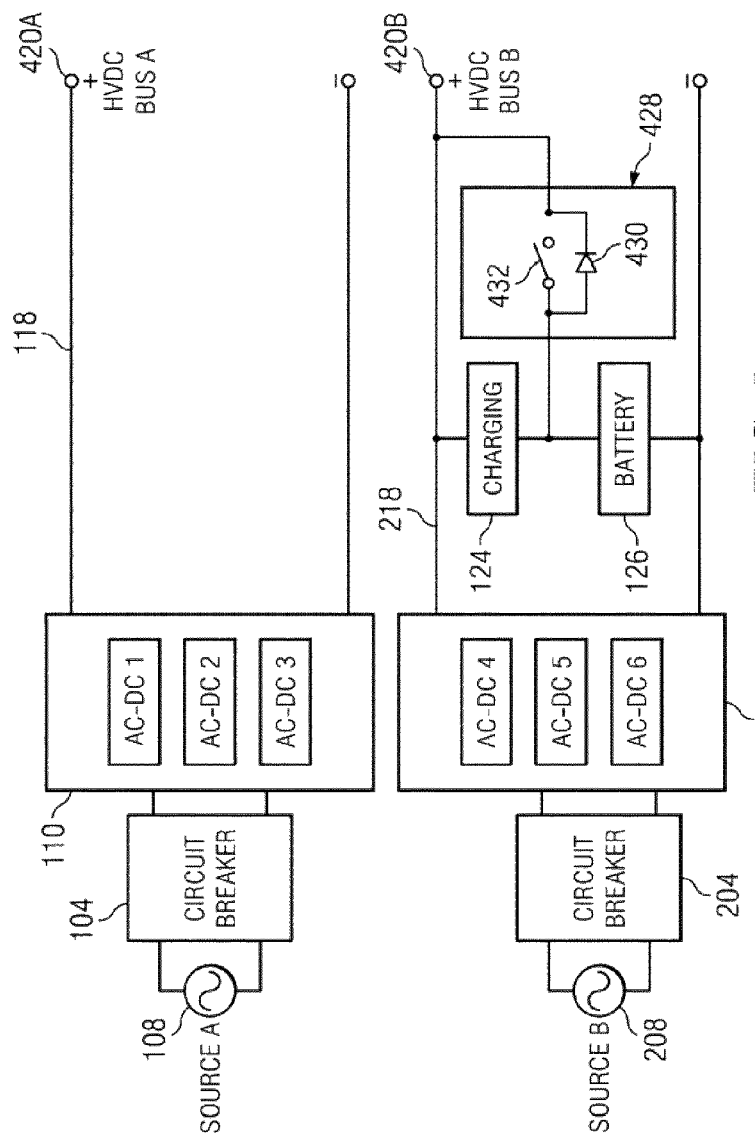
FIG. 5 is a schematic diagram corresponding to the embodiment of FIG. 4.

FIG. 5 is a schematic diagram corresponding to the embodiment of FIG. 4. As can be seen, buses 420A and 420B are independent in system 400, not parallel as in system 200. But like system 200, the voltage level kept on battery 126 may be slightly lower than the nominal high-voltage DC level kept on buses 420A and 420B during normal operation. Thus, upon a drop in voltage on bus 420B, diode 430 will become forward biased. When current flow is sensed in diode 430, switch 432 may be closed to connect battery 126 to bus 420B. Different switching circuitry 428 may be employed as well, depending on the needs of the application.

Figure 6:
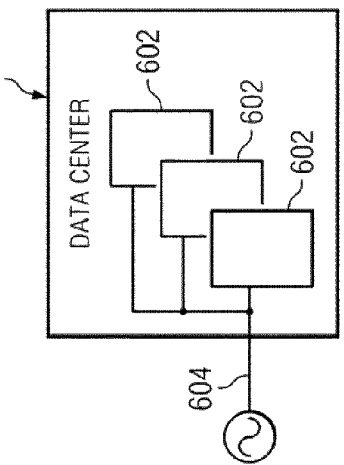
FIG. 6 is a block diagram illustrating an example data center utilizing equipment racks such as those of FIGS. 1-5, according to an embodiment of the invention.

FIG. 6 illustrates a datacenter 600 that utilizes equipment racks such as those of FIGS. 1-5 according to another embodiment of the invention. Data center 600 may house numerous racks 602 as shown, each built in accordance with systems 100, 200 and/or 400. Data center 600 receives an AC power feed 602 from outside of the data center. For example, AC power feed 602 may be provided by an electric utility grid such as that of a public utility company. Inside the data center, power feed 602 may be distributed directly to racks 602 without the need for step-down transformers as would be used in a traditional data center. Thus the AC voltage level fed to each rack may be the same as the voltage level of data center AC power feed 604. The elimination of a step-down transformer or transformers between power feed 604 and racks 602 provides efficiency improvements over traditional power conversion and distribution schemes because step-down transformers are a source of power loss. Moreover, a central uninterruptible power supply backup system can be eliminated in data center 600 because each of racks 602 may contain its own battery backup system 122, 222, 422.

If AC power feed 604 is supplied from an electric utility grid, in the United States the voltage level may be approximately 480VRMS. In Europe, the level may be approximately between 315 and 415VRMS. Other voltage levels may also be used.

Figure 7:
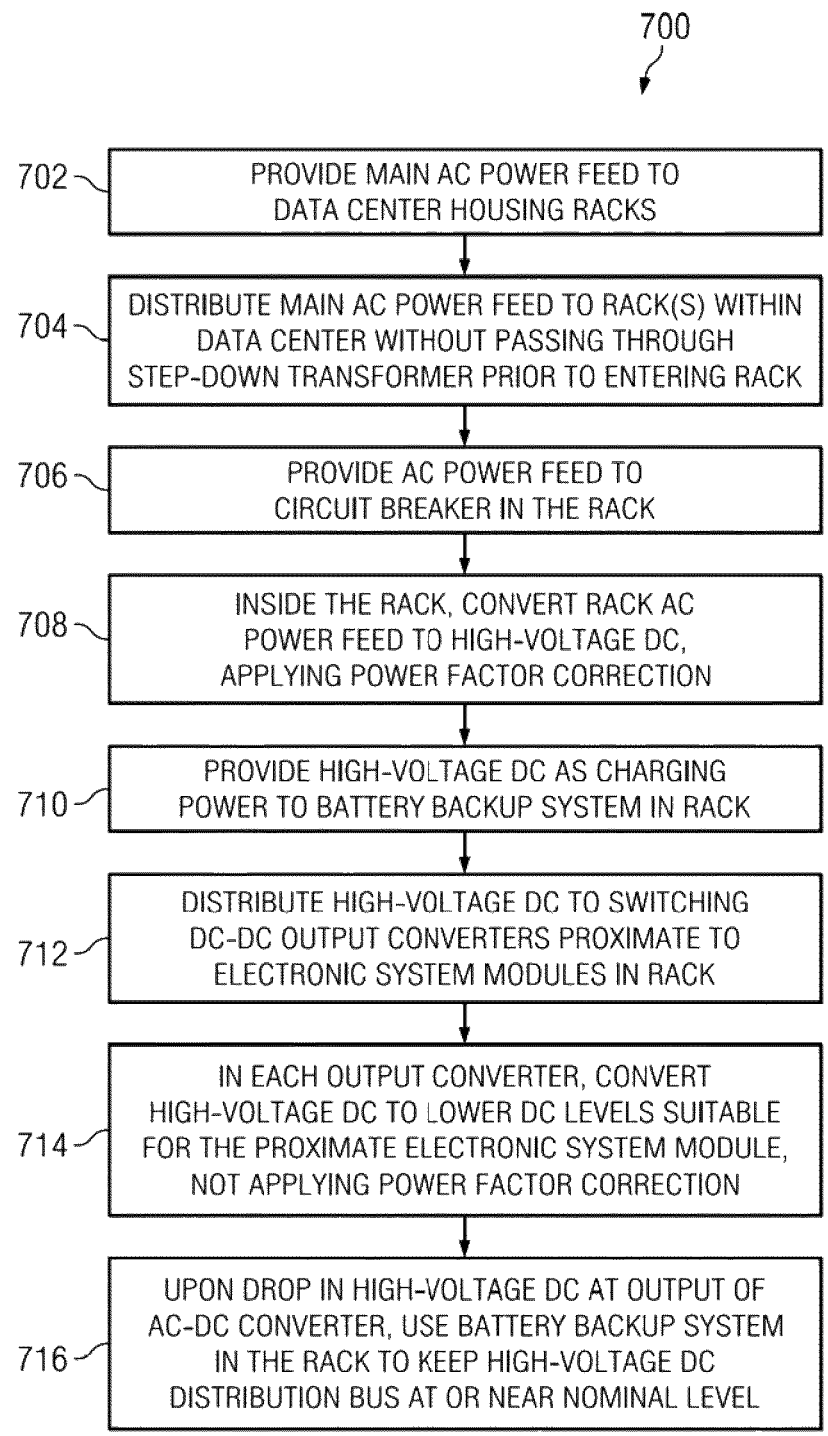
FIG. 7 is a flow diagram generally illustrating a method of providing power to plural electronic system modules in a rack according to an embodiment of the invention.

FIG. 7 is a flow diagram generally illustrating a method of providing power to electronic system modules in an electronic equipment rack according embodiments of the invention. In step 702, a main AC power feed is applied to a data center housing one or more electronic equipment racks. In step 704, this main AC power feed is distributed to the racks within the data center. This step may be done without passing the power feed through step-down transformers prior to bringing the feed to the racks. In step 706, the power feed may be connected to each rack at a circuit breaker located at the rack. In step 708, a rack AC power feed may be taken from the circuit breaker for the respective rack and converted to a high-voltage DC level. The latter step may be accomplished in conjunction with applying power factor correction. In step 710, the high-voltage DC level may be applied as charging power to a battery backup system located within the rack. In step 712, the high-voltage level may distributed—as with a bus—to each of numerous switching DC-DC output converters located proximate to one or more electronic system modules within the rack. In step 714, each DC-DC output converter may convert the high-voltage DC level to a lower-level DC voltage suitable for consumption by the proximate electronic system module. The latter step may be done without applying power factor correction because none of the DC-DC output converters requires any AC power input. Indeed, one of the advantages of architectures according to embodiments of the invention is that there is no need for a complete power supply with an AC power input to be placed proximate to each electronic system module; rather, only a DC-DC output converter need be placed there. In step 716, should a drop in the high-voltage DC level occur on the bus for any reason, the battery backup system in the rack may be used to keep the bus at or near its nominal level. The steps of method 700 may be implemented using any mix of the systems described above in relation to FIG. 1-6, or may employ other systems.

Among the advantages gained by embodiments of the invention are space and cost savings within the data center, as step-down transformers and bulky central uninterruptible power supply systems may be eliminated. In addition, components within the racks themselves may represent a cost savings over prior art systems in that the output converters proximate to the electronic system modules in each rack are simplified. They need not include input converters or power factor correction circuitry, since that function is provided once in each rack by the main AC-DC converter for the entire rack.

While the invention has been described in detail with reference to preferred embodiments thereof, the described embodiments have been presented by way of example and not by way of limitation. It will be understood by those skilled in the art and having reference to this specification that various changes may be made in the form and details of the described embodiments without deviating from the spirit and scope of the invention as defined by the appended claims.

In the appended claims, the words "comprising" and "comprises" are to be read in the open sense to mean "including the following elements but not excluding others."

What is claimed is:

1. A system, comprising:
an electronic equipment rack;
a first circuit breaker mounted to the rack and configured to receive a first rack AC power feed;
a first AC-DC converter module mounted to the rack and configured to receive the first rack AC power feed from the first circuit breaker and to convert it to a first DC voltage at a first output;
plural electronic system modules mounted in the rack;
a first set of switching DC-DC output converters, each disposed physically proximate to or within one of the electronic system modules and configured to convert the first DC voltage to a second DC voltage suitable for consumption by the proximate electronic system module;
a first bus configured to distribute the first DC voltage from the first output to each of the switching DC-DC output converters in the first set; and
a battery backup system configured to receive charging power from the first AC-DC converter module and comprising a switching system configured to detect current flow through a plurality of diodes based on a reduction of voltage on the first bus resulting from one of a failure in the first rack AC power feed and a failure in the first AC-DC converter module, the switching system coupling a battery to the bus via a respective plurality of switches in response to the detected current flow to maintain the first bus at approximately the first DC voltage.

2. The system of claim 1, further comprising:
a second circuit breaker mounted to the rack and configured to receive a second rack AC power feed;
a second AC-DC converter module mounted to the rack and configured to receive the second rack AC power feed from the second circuit breaker and to convert it to the first DC voltage at a second output;
wherein each of the electronic system modules is associated with at least two redundant output converters taken from among the first set of switching DC-DC output converters; and
wherein the bus is configured to be connected to the second output as well as the first output, and to each of the redundant output converters in parallel.

3. The system of claim 1, further comprising:
a second circuit breaker mounted to the rack and configured to receive a second rack AC power feed;
a second AC-DC converter module mounted to the rack and configured to receive the second rack AC power feed from the second circuit breaker and to convert it to the first DC voltage at a second output;
a second set of switching DC-DC output converters like the first set;
wherein each of the electronic system modules is associated with at least two redundant output converters A and B, the A converters taken from among the first set and the B converters taken from among the second set; and
a second bus configured to be connected to the second output and to distribute the first DC voltage from the second output to each of the switching DC-DC output converters in the second set.

4. The system of claim 1, wherein:
the first AC-DC converter module includes power factor correction circuitry and none of the switching DC-DC output converters in the first set includes an AC power input.

5. The system of claim 1, wherein:
the first AC-DC converter module comprises at least two redundant AC-DC converters operating in parallel.

6. The system of claim 1 wherein the rack is one of plural similar racks, and further comprising:
a data center housing the plural racks and configured to receive a first data center AC power feed;
wherein the first data center AC power feed is coupled to each of the plural racks; and
wherein the voltage level of the first rack AC power feed is the same as the voltage level of the first data center AC power feed.

7. The system of claim 1, wherein: the first DC voltage is at least 350 volts.

8. The system of claim 1, wherein: the first rack AC power feed is approximately 480 volts RMS.

9. The system of claim 1, wherein: the first rack AC power feed is between approximately 315 and 415 volts RMS.

10. The system of claim 1, wherein: each of the electronic system modules comprises a server computer system board; and the rack is a server computer rack.

11. A method of providing power to plural electronic system modules in a rack, comprising:
providing a rack AC power feed to a circuit breaker located at the rack;
inside the rack, converting the rack AC power feed from the circuit breaker to a first DC voltage at a first output;
distributing the first DC voltage from the first output to plural switching DC-DC output converters, wherein each of the switching DC-DC output converters is disposed physically proximate to or within one of the electronic system modules; and
in each of the switching DC-DC output converters, converting the first DC voltage to a second DC voltage suitable for consumption by the proximate electronic system module;
wherein converting the rack AC power feed to the first DC voltage includes applying power factor correction, and converting the first DC voltage to the second DC voltage does not include applying power factor correction.

12. The method of claim 11, further comprising;
providing the first DC voltage as charging power to a battery backup system that is switchably coupled to a bus for distributing the first DC voltage to the switching DC-DC output converters; and
using the battery backup system to keep the bus at or near the first DC voltage in the event of a failure in the rack AC power feed or a failure in converting the rack AC power feed to the first DC voltage.

13. The method of claim 11, further comprising:
providing a main AC power feed to a data center that houses the rack; and
distributing the main AC power feed to the rack as the rack AC power feed such that the main AC power feed and the rack AC power feed have the same voltage level.

14. The method of claim 11, further comprising:
associating each of the electronic system modules with at least two redundant DC-DC output converters;
providing a redundant rack AC power feed to the rack;
inside the rack, converting the redundant rack AC power feed to the first DC voltage at a second output; and
distributing the first DC voltage from the first and second outputs in parallel to each of the redundant output converters.

15. The method of claim 11, further comprising:

associating each of the electronic system modules with at least two redundant DC-DC output converters A and B;

providing a redundant rack AC power feed to the rack;

inside the rack, converting the redundant rack AC power feed to the first DC voltage at a second output;

distributing the first DC voltage from the first output to the A output converters; and distributing the first DC voltage from the second output to the B output converters.

16. The method of claim 11, wherein: the electronic system modules comprise server computer system boards.

17. A system, comprising:

an electronic equipment rack configured to house a plurality of electronic system modules in separate physical slots within the rack, each module associated with a different switching DC-DC output converter;

means in the rack for converting a rack AC power feed to a DC voltage, the means for converting the rack AC power feed to the DC voltage including power factor correction circuitry; and means for distributing the DC voltage to each of the switching DC-DC output converters.

18. The system of claim 17:

wherein the means for distributing the DC voltage comprises a bus; and further comprising means in the rack for keeping the bus at or near the DC voltage in the event of a failure in the rack AC power feed or a failure in the means for converting the rack AC power feed to the DC voltage.

19. The system of claim 18, wherein: the means for keeping the bus at or near the DC voltage comprises a battery backup system that is configured to take charging power from the bus.

20. The system of claim 1, wherein the first AC-DC converter module is configured to apply power factor correction in providing the first DC voltage at the first output.

* * * * *